(12) United States Patent
Hsu et al.

(10) Patent No.: US 9,768,064 B1
(45) Date of Patent: Sep. 19, 2017

(54) FORMATION METHOD OF SEMICONDUCTOR DEVICE STRUCTURE

(71) Applicant: Taiwan Semiconductor Manufacturing Co., Ltd., Hsinchu (TW)

(72) Inventors: Chun-Wei Hsu, Hsinchu (TW); Chi-Jen Liu, Taipei (TW); Cheng-Chun Chang, Taoyuan (TW); Yi-Sheng Lin, Taichung (TW); Liang-Guang Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/210,037

(22) Filed: Jul. 14, 2016

(51) Int. Cl.
*H01L 21/4763* (2006.01)
*H01L 21/768* (2006.01)
*H01L 23/528* (2006.01)
*H01L 23/532* (2006.01)
*H01L 21/311* (2006.01)
*H01L 21/8234* (2006.01)

(52) U.S. Cl.
CPC .. *H01L 21/76883* (2013.01); *H01L 21/31111* (2013.01); *H01L 21/31116* (2013.01); *H01L 21/76802* (2013.01); *H01L 21/76832* (2013.01); *H01L 21/823475* (2013.01); *H01L 23/5283* (2013.01); *H01L 23/53242* (2013.01)

(58) Field of Classification Search
CPC ............. H01L 21/314; H01L 21/31155; H01L 21/76814; H01L 21/76831; H01L 21/0234; H01L 21/02304; H01L 21/02321; H01L 21/02351; H01L 21/76826; H01L 21/31695; H01L 21/02107; H01L 29/66795; H01L 29/785; H01L 29/78684; H01L 21/26586
USPC .................. 438/640, 783, 618, 634, 637
See application file for complete search history.

(56) References Cited

U.S. PATENT DOCUMENTS

| | | | |
|---|---|---|---|
| 6,171,951 B1 * | 1/2001 | Lee | H01L 21/02107 257/E21.248 |
| 7,667,271 B2 | 2/2010 | Yu et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |

(Continued)

*Primary Examiner* — Evan Pert
*Assistant Examiner* — Changhyun Yi
(74) *Attorney, Agent, or Firm* — McClure, Qualey & Rodack, LLP

(57) ABSTRACT

Formation methods of a semiconductor device structure are provided. The method includes providing a substrate having a low topography region and a high low topography region. The method also includes forming a first dielectric layer over the substrate. The method further includes forming a second dielectric layer over the stop layer. In addition, the method includes forming an opening in the first dielectric layer, the stop layer and the second dielectric layer. The method also includes forming a conductive material layer over the second dielectric layer. The conductive material layer fills the opening. The method further includes performing a polishing process over the conductive material layer until a top surface of the stop layer is exposed.

20 Claims, 10 Drawing Sheets

(56) References Cited

U.S. PATENT DOCUMENTS

| | | | |
|---|---|---|---|
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 2007/0155157 A1* | 7/2007 | Chou | H01L 21/76802 438/618 |
| 2009/0189142 A1* | 7/2009 | Chen | H01L 45/06 257/4 |
| 2014/0001574 A1 | 1/2014 | Chen et al. | |
| 2014/0110755 A1 | 4/2014 | Colinge | |
| 2014/0151812 A1 | 6/2014 | Liaw | |
| 2015/0368094 A1* | 12/2015 | Howard | B81C 1/00095 257/763 |

\* cited by examiner

FORMATION METHOD OF SEMICONDUCTOR DEVICE STRUCTURE

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
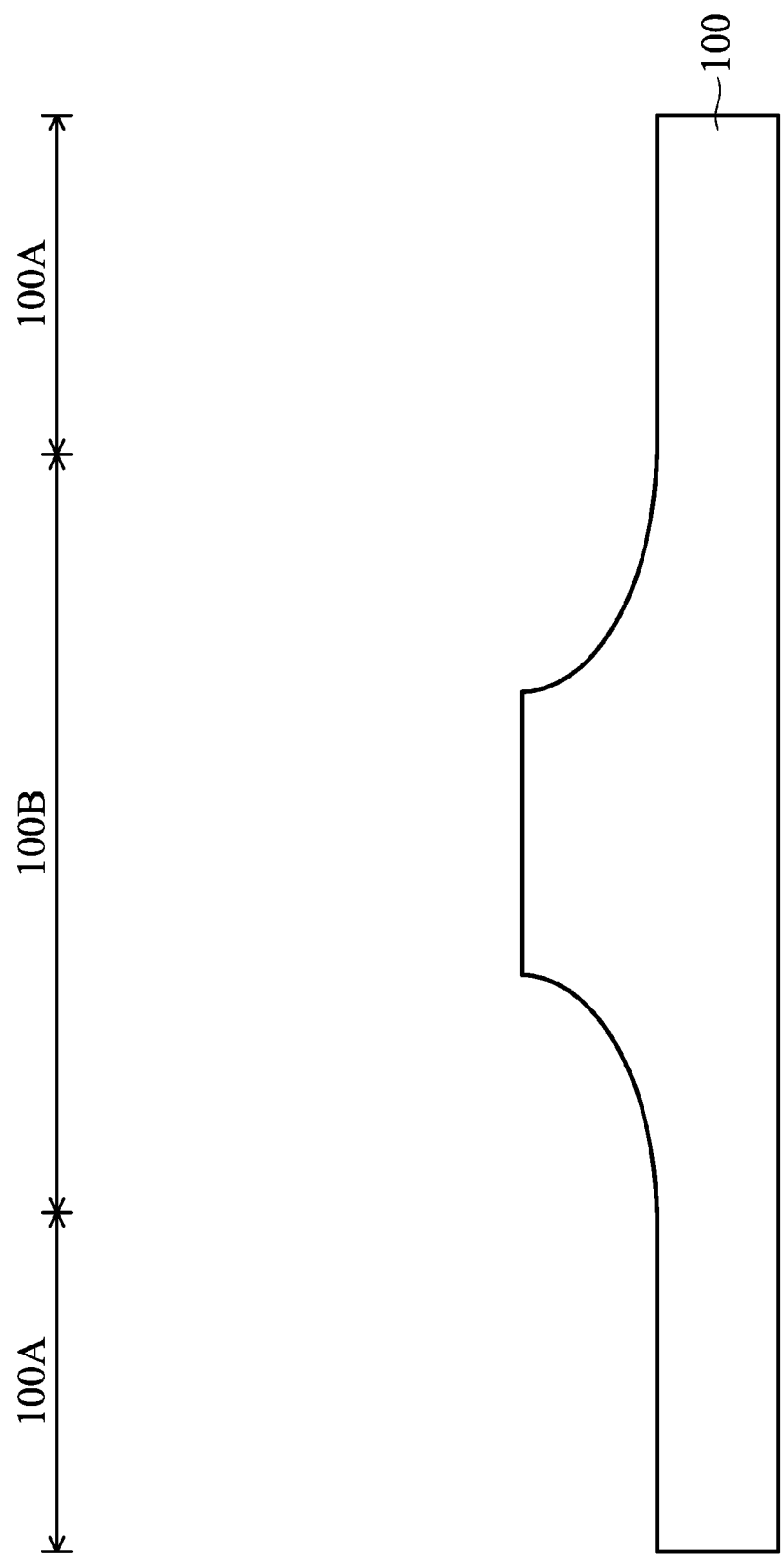
FIGS. 1A-1J are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1J are cross-sectional views of various stages of a process for forming a semiconductor device structure, in accordance with some embodiments. Additional operations can be provided before, during, and/or after the stages described in FIGS. 1A-1J. Some of the stages that are described can be replaced or eliminated for different embodiments. Additional features can be added to the semiconductor device structure. Some of the features described below can be replaced or eliminated for different embodiments.

As shown in FIG. 1A, a substrate 100 is provided. In some embodiments, the substrate 100 includes a semiconductor layer. In some embodiments, the semiconductor layer is a bulk semiconductor substrate, such as a semiconductor wafer. For example, the semiconductor layer is a silicon wafer. The semiconductor layer may include silicon or another elementary semiconductor material such as germanium. In some other embodiments, the semiconductor layer includes a compound semiconductor. The compound semiconductor may include silicon germanium, gallium arsenide, silicon carbide, indium arsenide, indium phosphide, another suitable compound semiconductor, or a combination thereof.

In some embodiments, the semiconductor layer includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In some embodiments, isolation features (not shown) are formed in the semiconductor layer. The isolation features are used to define active regions and electrically isolate various device elements formed in and/or over the semiconductor layer in the active regions. In some embodiments, the isolation features include shallow trench isolation (STI) features, local oxidation of silicon (LOCOS) features, other suitable isolation features, or a combination thereof.

Examples of the various device elements, which may be formed in and/or on the semiconductor layer, include transistors, diodes, another suitable element, or a combination thereof. For example, the transistors may be metal oxide semiconductor field effect transistors (MOSFET), complementary metal oxide semiconductor (CMOS) transistors, bipolar junction transistors (BJT), high voltage transistors, high-frequency transistors, p-channel and/or n channel field effect transistors (PFETs/NFETs), etc. Various processes are performed to form the various device elements, such as deposition, etching, implantation, photolithography, annealing, planarization, another applicable process, or a combination thereof.

As shown in FIG. 1A, a low topography region 100A and a high topography region 100B are defined, in accordance with some embodiments. A portion of the substrate 100 in the high topography region 100B is thicker than a portion of the substrate 100 in the low topography region 100A. For example, there is an isolation feature in the semiconductor layer in the low topography region 100A while there is a device element on the semiconductor layer in the high topography region 100B.

There may be different pattern densities on the semiconductor layer. As a result, the substrate 100 has non-uniform surface profile. Pattern density refers to the number of features that are located within a given region of a substrate. For example, the low topography region 100A and the high topography region 100B may have different pattern densities. In some embodiments, the high topography region 100B has a higher pattern density than the low topography region 100A.

The topography or profile of the substrate 100 may be observed using an electron microscope such as an atomic force microscope (AFM). It should be noted that the topography or profile of the substrate 100 shown in figures is only an example and is not a limitation to the disclosure. In some other embodiments, the low topography region 100A and the high topography region 100B are not defined.

In some embodiments, an interconnection structure is subsequently formed on the substrate 100. The interconnection structure includes an interlayer dielectric layer (ILD), inter-metal dielectric (IMD) layers, and multiple conductive features in the ILD layer and IMD layers. The conductive features may include conductive contacts, conductive lines and/or conductive vias. In some embodiments, the ILD layer includes multiple dielectric sub-layers.

Many variations and/or modifications can be made to embodiments of the disclosure. In some other embodiments, the substrate 100 includes a portion of an interconnection structure, such as an ILD layer and conductive features in the ILD layer, on the semiconductor layer. Another portion of the interconnection structure, such as IMD layers and conductive features in the IMD layers, is subsequently formed on the substrate 100.

Figure 1B:
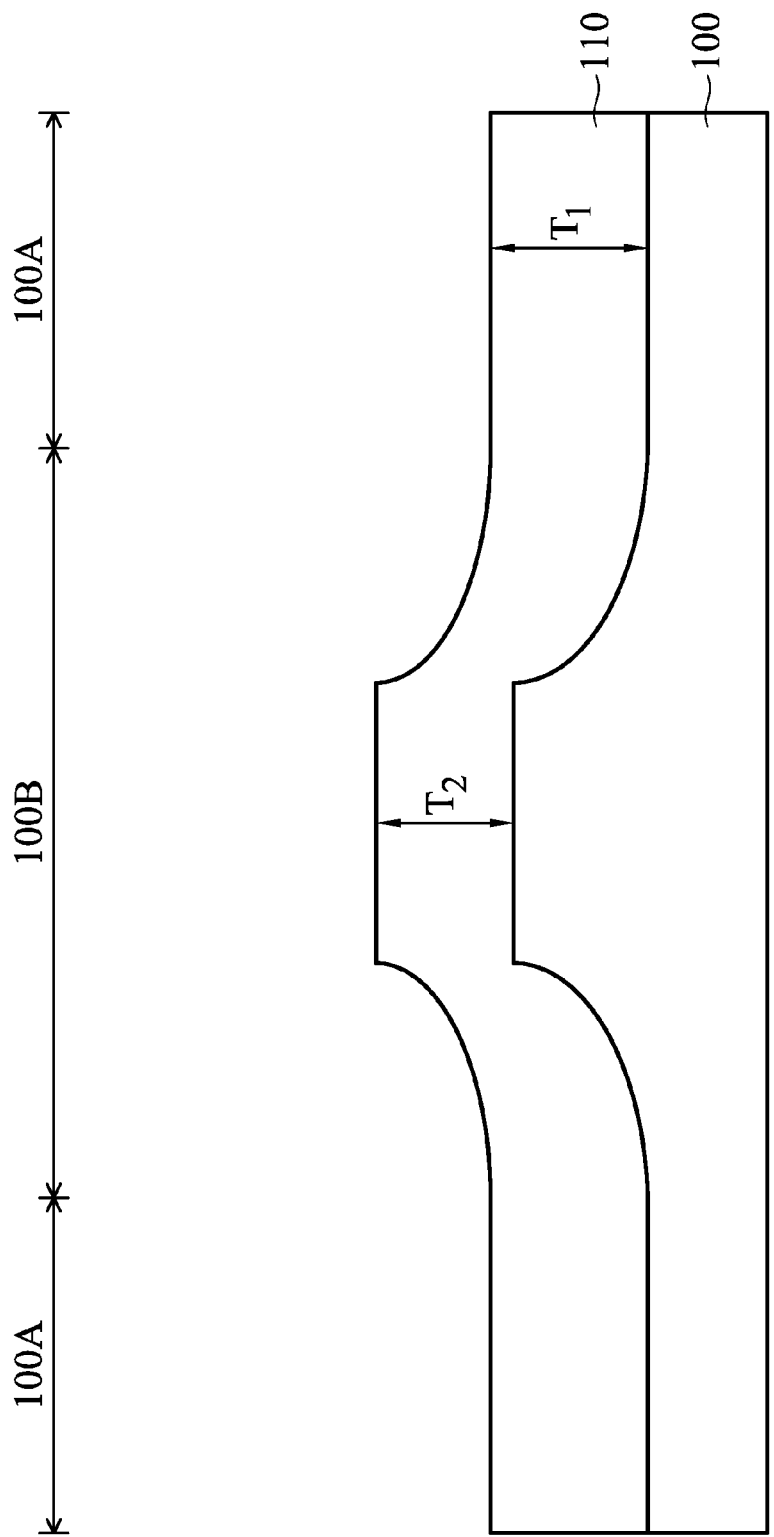

As shown in FIG. 1B, a dielectric layer 110 is deposited over the substrate 100 in the low topography region 100A and the high topography region 100B, in accordance with some embodiments. The dielectric layer 110 may serve as an ILD layer of an interconnection structure or a dielectric sub-layer of the ILD layer. In some embodiments, the dielectric layer 110 is conformably deposited over the substrate 100. As a result, the thickness $T_1$ of a portion of the dielectric layer 110 in the low topography region 100A is substantially the same as the thickness $T_2$ of a portion of the dielectric layer 110 in the high topography region 100B.

Embodiments of the disclosure are not limited thereto. In some other embodiments, the dielectric layer 110 is disconformably deposited over the substrate 100. The thickness $T_1$ may be different from the thickness $T_2$.

In some embodiments, the dielectric layer 110 is made of silicon oxide, borosilicate glass (BSG), phosphoric silicate glass (PSG), borophosphosilicate glass (BPSG), fluorinated silicate glass (FSG), porous dielectric material, another suitable low-k dielectric material, or a combination thereof. In some embodiments, the dielectric layer 110 is deposited using a chemical vapor deposition (CVD) process, a spin-on process, a spray coating process, another applicable process, or a combination thereof.

Figure 1C:
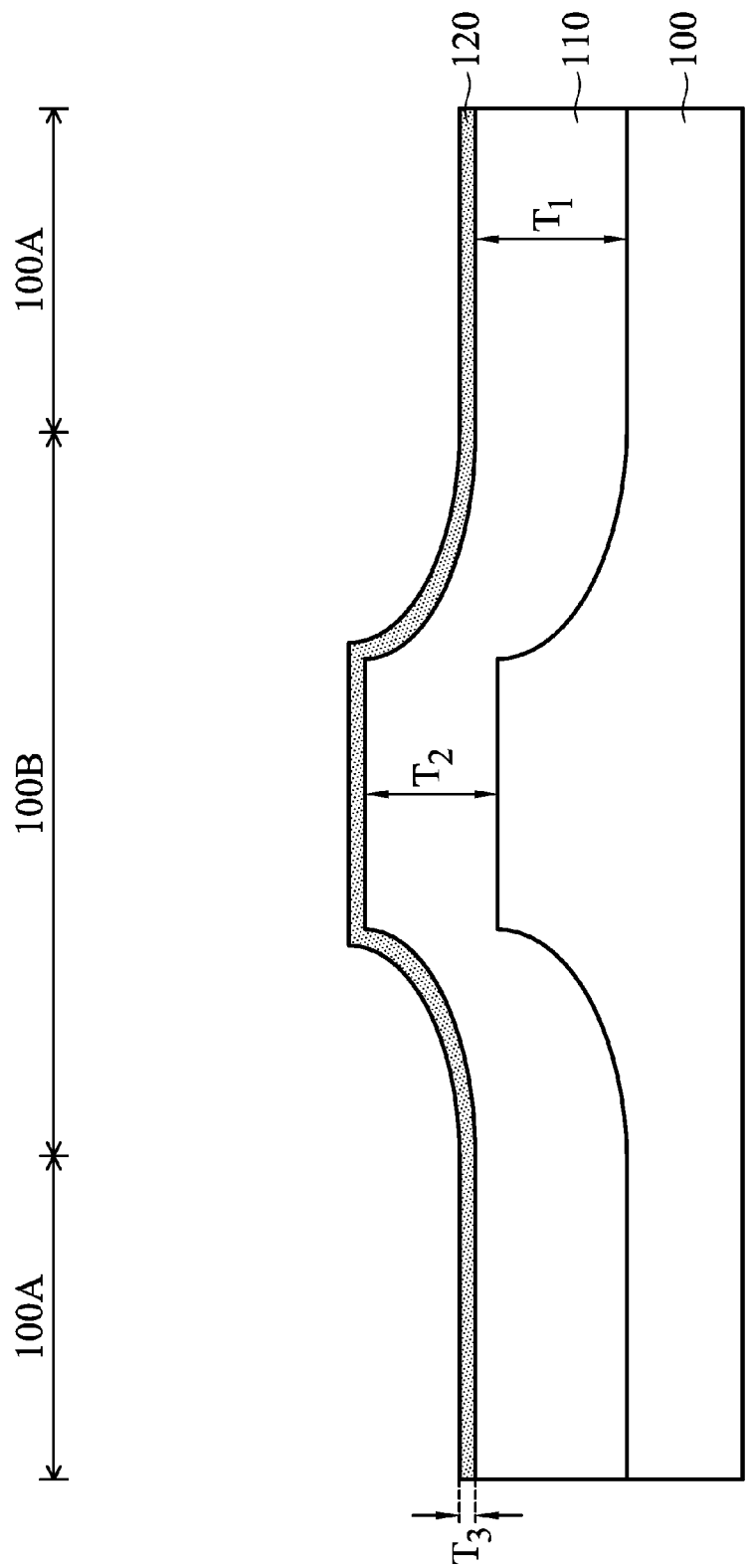

As shown in FIG. 1C, a dielectric layer 120 is deposited over the dielectric layer 110 in the low topography region 100A and the high topography region 100B, in accordance with some embodiments. The dielectric layer 120 serves as a stop layer of a planarization process, which will be described in more detail later. The dielectric layer 120 is used to protect the dielectric layer 110 from being removed during the subsequent planarization process.

In some embodiments, the dielectric layer 120 is conformably deposited over the dielectric layer 110. In some embodiments, the thickness $T_3$ of the dielectric layer 120 is less than the thickness $T_1$ and thickness $T_2$ of the dielectric layer 110.

In some embodiments, the dielectric layer 120 is made of silicon nitride (SiN), silicon oxynitride (SiON), another suitable material, or a combination thereof. In some embodiments, the dielectric layer 120 is made of a material which is hardly removed during the subsequent planarization process. For example, the dielectric layer 120 may be polished by the polishing slurry used in the subsequent planarization process at a very low polishing rate. In some embodiments, the dielectric layer 120 is made of a material which is different from that of the dielectric layer 110. For example, the dielectric layer 110 may be an oxide layer while the dielectric layer 120 may be a nitride layer.

In some embodiments, the dielectric layer 120 is deposited using a CVD process, a spin-on process, a spray coating process, another applicable process, or a combination thereof. In some embodiments, the formation of the dielectric layer 120 and the formation of the dielectric layer 110 comprise performing the same deposition process.

Figure 1D:
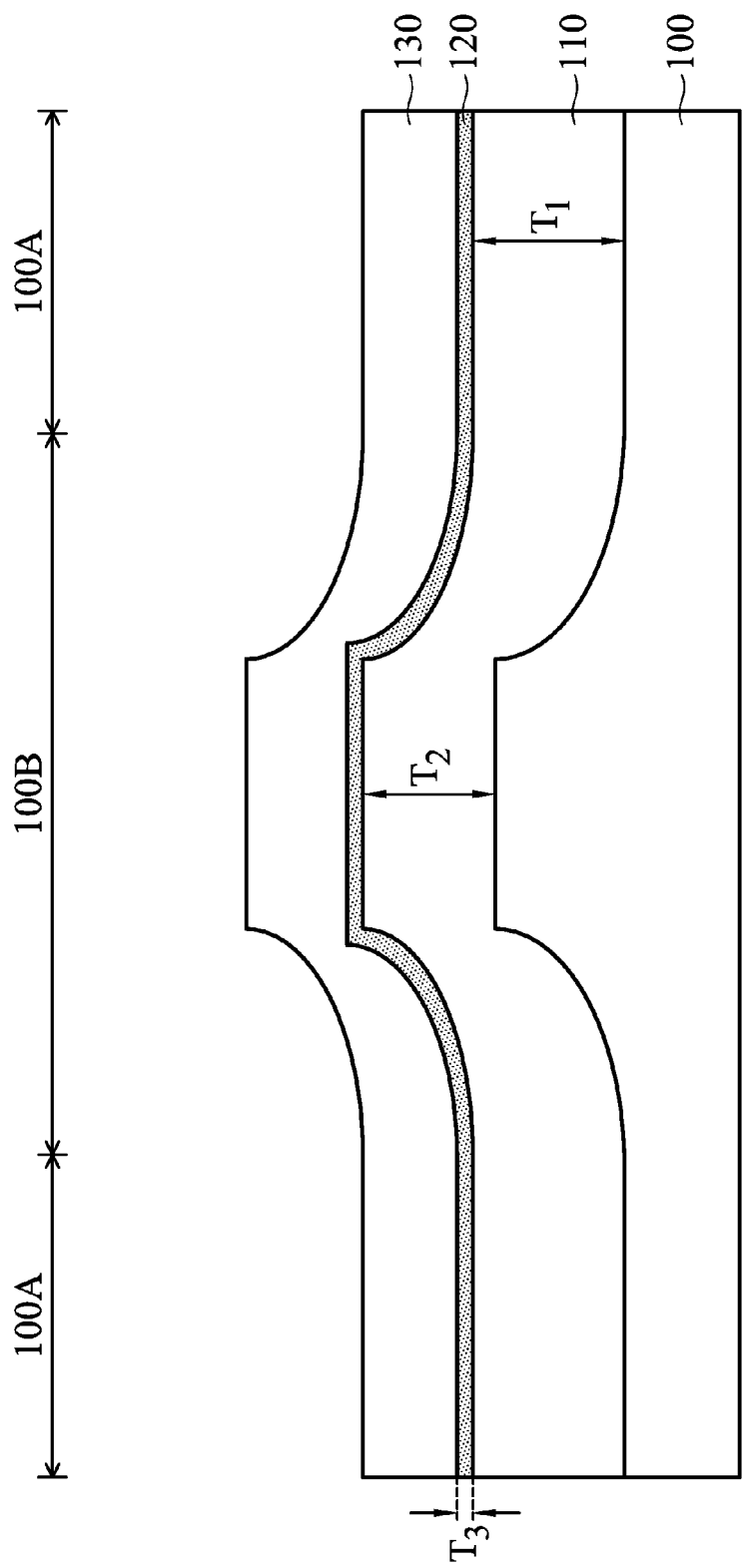

As shown in FIG. 1D, a dielectric layer 130 is deposited over the dielectric layer 120 in the low topography region 100A and the high topography region 100B, in accordance with some embodiments. The dielectric layer 130 serves as a sacrificial layer during the subsequent planarization process. In some embodiments, the dielectric layer 130 is conformably deposited over the dielectric layer 120. In some other embodiments, the dielectric layer 130 is disconformably deposited over the dielectric layer 120. The dielectric layer 130 is separated from the dielectric layer 110 by the dielectric layer 120.

In some embodiments, the thickness of the dielectric layer 130 is greater than the thickness $T_3$ of the dielectric layer 120. In some embodiments, the thickness of the dielectric layer 130 is less than the thickness $T_1$ and thickness $T_2$ of the dielectric layer 120. In some other embodiments, the thickness of the dielectric layer 130 is substantially the same as or greater than the thickness $T_1$ and thickness $T_2$ of the dielectric layer 120.

In some embodiments, the dielectric layer 130 is made of silicon oxide, BSG, PSG, BPSG, FSG, porous dielectric material, another suitable low-k dielectric material, or a combination thereof. The material of the dielectric layer 130 may be the same as or different from that of the dielectric layer 110. In some embodiments, the dielectric layer 130 is made of a material which is removed during the subsequent planarization process. In some embodiments, the dielectric layer 130 is deposited using a CVD process, a spin-on process, a spray coating process, another applicable process, or a combination thereof.

Figure 1E:
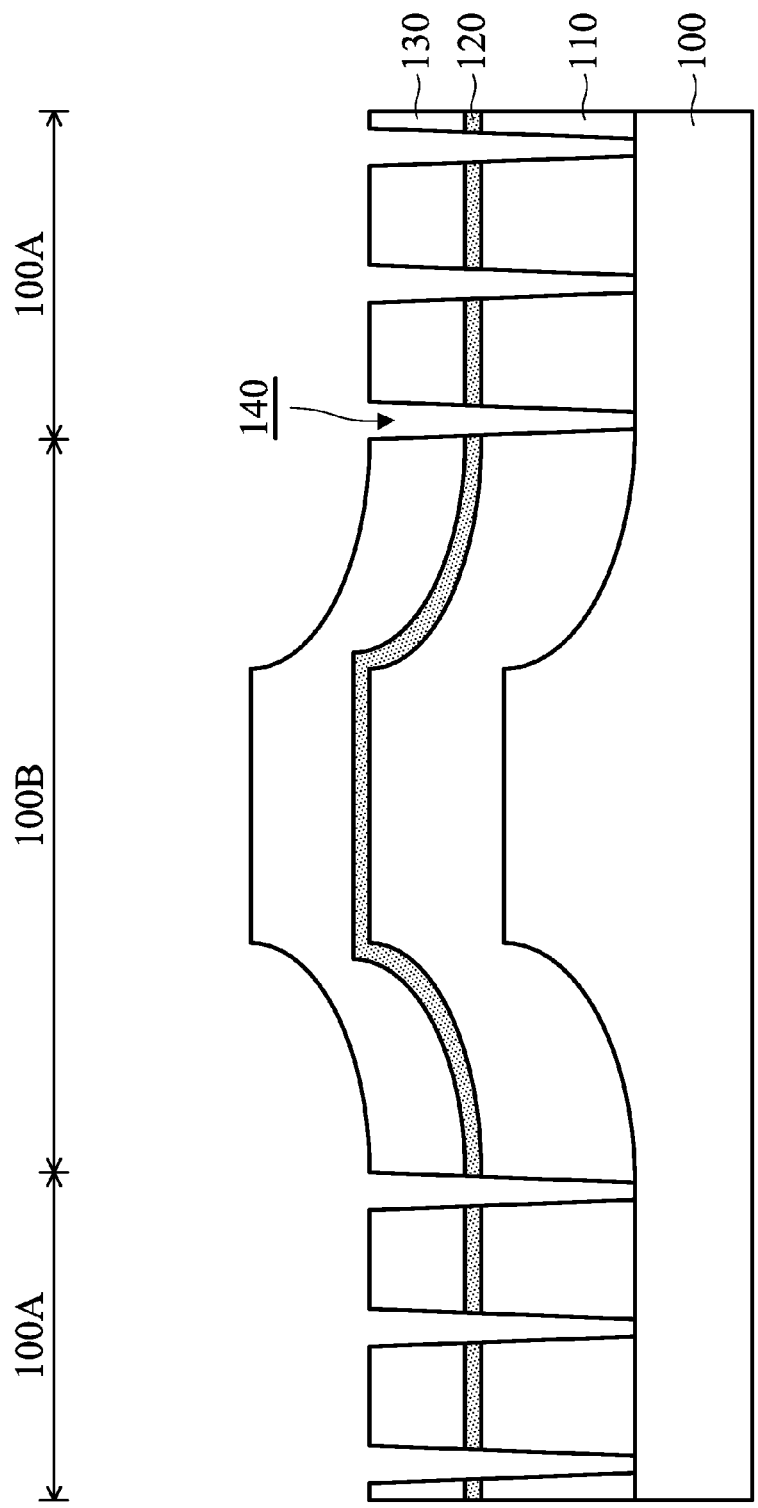

As shown in FIG. 1E, openings 140 are formed in the dielectric layers 110, 120 and 130, in accordance with some embodiments. As a result, portions of the substrate 100, such as conductive features of device elements or an interconnection structure, are exposed. For example, the conductive features of device elements may be source/drain structures or gate structures. The conductive features of an interconnection structure may be conductive contacts or plugs in a dielectric sub-layer of an ILD layer.

The openings 140 may be formed in the low topography region 100A and/or the high topography region 100B. In some embodiments, the openings 140 include trenches, via holes, or a combination thereof. In some embodiments, the openings 140 are formed using multiple photolithography and etching processes, another applicable process, or a combination thereof.

Figure 1F:
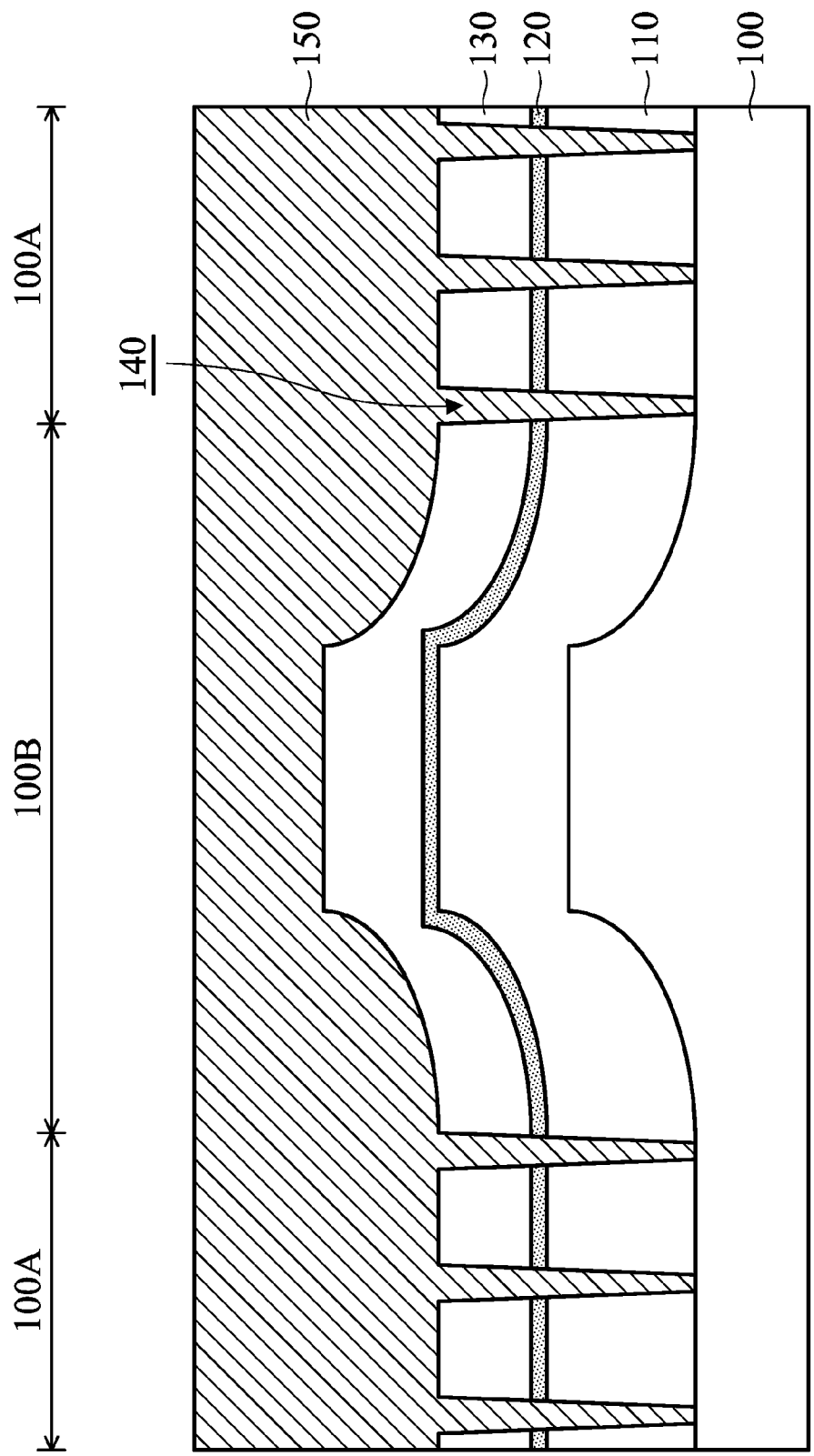

As shown in FIG. 1F, a conductive material layer 150 is deposited over the dielectric layer 130 in the low topography region 100A and the high topography region 100B, in accordance with some embodiments. The conductive material layer 150 further fills the openings 140 in the dielectric layers 110, 120 and 130. As a result, the conductive material layer 150 is in direct contact with the exposed portions of the substrate 100.

In some embodiments, the conductive material layer 150 is made of tungsten, aluminum, copper, gold, platinum, titanium, another suitable material, or a combination thereof. In some embodiments, the conductive material layer 150 is deposited using a CVD process, a physical vapor deposition (PVD) process, an electroplating process, an electroless plating process, another applicable process, or a combination thereof.

Figure 1G:
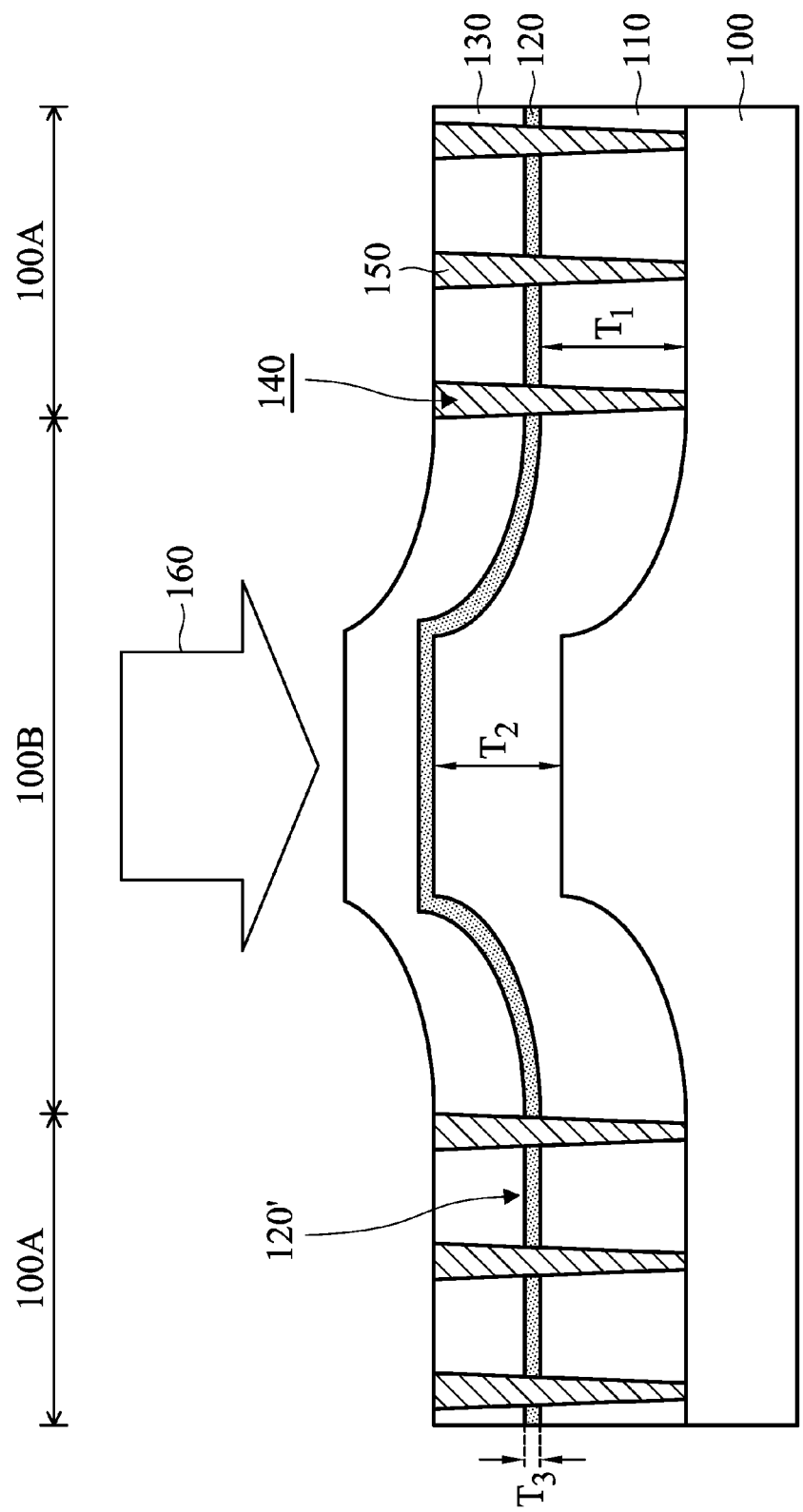
Figure 1H:
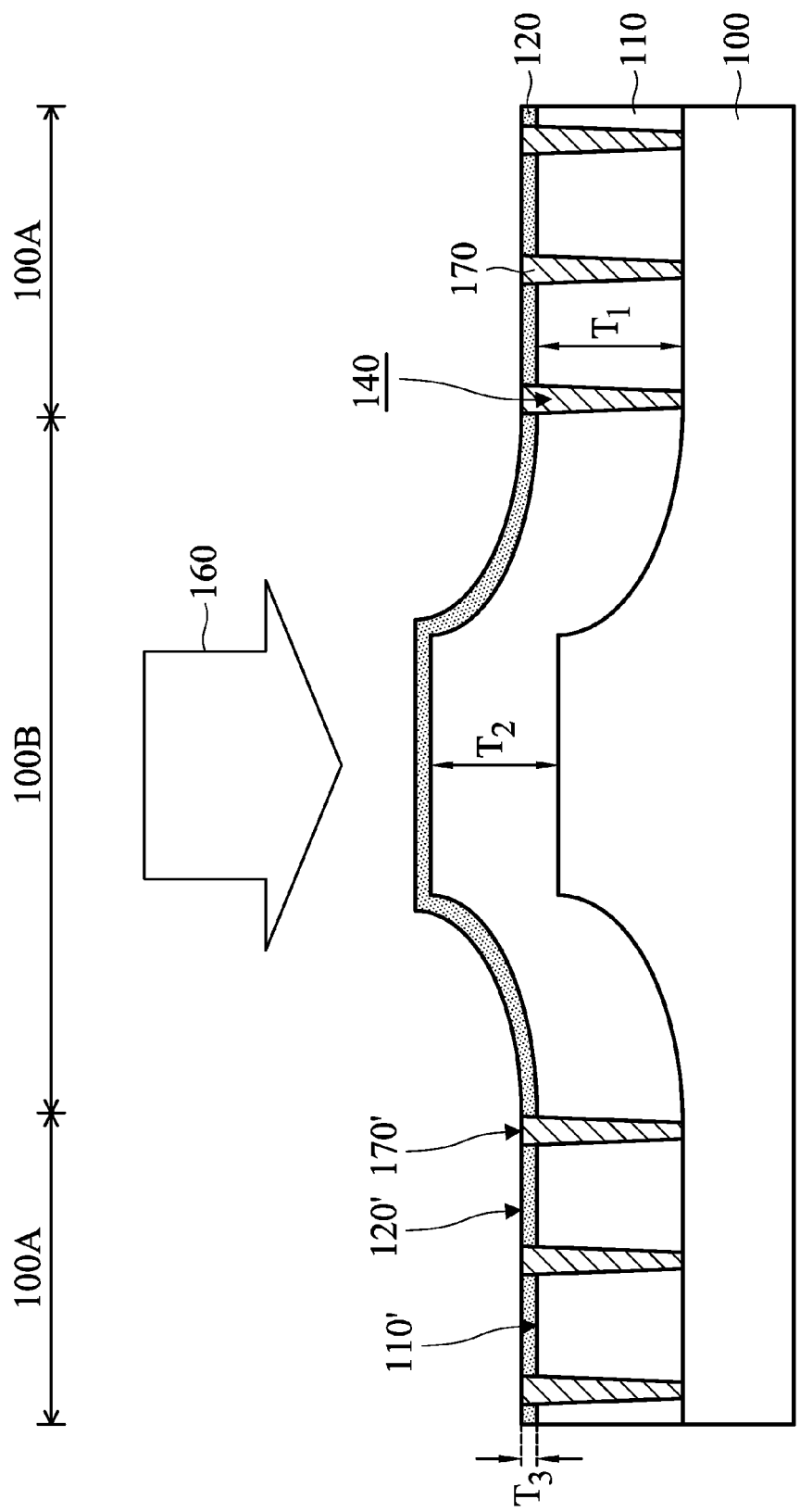

As shown in FIGS. 1G and 1H, a planarization process 160 is performed over the conductive material layer 150, in accordance with some embodiments. The planarization process 160 is used to remove the conductive material layer 150 outside of the openings 140. During the planarization process 160, the conductive material layer 150 over the dielectric layer 130 gradually becomes thinner. The planarization process 160 is performed until the conductive material layer 150 over the dielectric layer 130 is substantially completely removed.

During the planarization process 160, the dielectric layer 130 also gradually becomes thinner. After the planarization process 160, the dielectric layer 130 is substantially completely removed. As a result, a portion of the conductive material layer 150 within the dielectric layer 130 is also removed. In some embodiments, the openings 140 become shallower during the planarization process 160.

In some embodiments, the dielectric layer 120 serves as a stop layer of the planarization process 160. The planarization process 160 is performed until the conductive material layer 150 and the dielectric layer 130 over the dielectric layer 120 are substantially completely removed. As a result, the planarization process 160 is substantially stopped when the top surface 120' of the dielectric layer 120 becomes exposed. In some embodiments, the dielectric layer 120 keeps substantially the same initial thickness $T_3$ and profile during the planarization process 160.

The dielectric layer 120 protects the dielectric layer 110 from being removed or damaged during the planarization process 160. In some embodiments, a portion of the dielectric layer 110 in the low topography region 100A keeps substantially the same initial thickness $T_1$ and profile during the planarization process 160. In some embodiments, a portion of the dielectric layer 110 in the high topography region 100B keeps substantially the same initial thickness $T_2$ and profile during the planarization process 160.

The planarization process 160 may include a chemical mechanical polishing (CMP) process, another applicable process, or a combination thereof. In some embodiments, a high selectivity polishing slurry is used in the planarization process 160. The polishing slurry includes abrasives (e.g., polishing agents), additives (e.g., surfactants), or a combination thereof. The abrasives may include $SiO_2$ particles, $Al_2O_3$ particles, $CeO_2$ particles, other suitable particles or a combination thereof. In some embodiments, different polishing slurries are used to separately remove the conductive material layer 150 and the dielectric layer 130. For example, first polishing slurry is used to remove the conductive material layer 150 until the top surface of the dielectric layer 130 is exposed. The conductive material layer 150 may partially remain over the top surface of the dielectric layer 130. Afterwards, second polishing slurry is used to remove the dielectric layer 130 until the top surface 120' of the dielectric layer 120 is exposed. However, embodiments of the disclosure are not limited thereto. In some other embodiments, the same polishing slurry is used to remove the conductive material layer 150 and the dielectric layer 130.

In some embodiments, the polishing slurry, which has a sufficiently high polish selectivity of the conductive material layer 150 to the dielectric layer 130, is used to remove the conductive material layer 150. As a result, the conductive material layer 150 is removed much faster than the dielectric layer 130. In some embodiments, the polishing slurry, which has a sufficiently high polish selectivity of the dielectric layer 130 to the dielectric layer 120, is used to remove the dielectric layer 130. As a result, the dielectric layer 130 is removed much faster than the dielectric layer 120.

In some embodiments, the polish selectivity of the dielectric layer 130 to the dielectric layer 120 is greater than that of the dielectric layer 130 to the conductive material layer 150 in the openings 140. As a result, the dielectric layer 130 and the conductive material layer 150 in the openings 140 are removed much faster than the dielectric layer 120.

In some embodiments, the polishing rate of the dielectric layer 120 is much less than that of the conductive material layer 150 and that of the dielectric layer 130. As a result, the dielectric layer 120 is hardly removed during the planarization process 160. In some embodiments, the ratio of the polishing rate of the dielectric layer 130 to the polishing rate of the dielectric layer 120 is in a range from about 10 to about 100.

Many variations and/or modifications can be made to embodiments of the disclosure. In some other embodiments, the ratio of the polishing rate of the dielectric layer 130 to the polishing rate of the dielectric layer 120 is greater than 100. Accordingly, it is much easier to cleanly remove the conductive material layer 150 and the dielectric layer 130 without residue and without removing or damaging the dielectric layer 110.

The remaining portions of the conductive material layer 150 in the openings 140 form conductive features 170, as shown in FIG. 1H in accordance with some embodiments. As a result, the conductive features 170 are connected to some portions of the substrate 100, such as conductive features of device elements or an interconnection structure. For example, the conductive features 170 may be conductive contacts or plugs and are connected to source/drain structures or gate structures. Alternatively, the conductive features 170 may be connected to conductive contacts or plugs in a dielectric sub-layer of an ILD layer.

Although FIG. 1H shows that the conductive features 170 are positioned in the low topography region 100A, embodiments of the disclosure are not limited thereto. In some other embodiments, one or more of the conductive features 170 are positioned in the high topography region 100B.

In some embodiments, an upper portion of the conductive features 170 is surrounded by the dielectric layer 120 and a lower portion of the conductive features 170 is surrounded by the dielectric layer 110. Namely, the upper portion of the conductive features 170 protrudes from the top surface 110' of the dielectric layer 110.

In some embodiments, the dielectric layer 120 encircles the upper portion of the conductive features 170 protruding from the dielectric layer 110. Therefore, particles (e.g., abrasives of the polishing slurry used in the planarization process 160) are prevented from being trapped and remaining in a corner between the conductive features 170 and the dielectric layer 110.

In some embodiments, the top surface 170' of the conductive features 170 is non-coplanar with the top surface 110' of the dielectric layer 110. In some embodiments, the top surface 170' of the conductive features 170 is substantially coplanar with the top surface 120' of the dielectric layer 120.

Figure 1I:
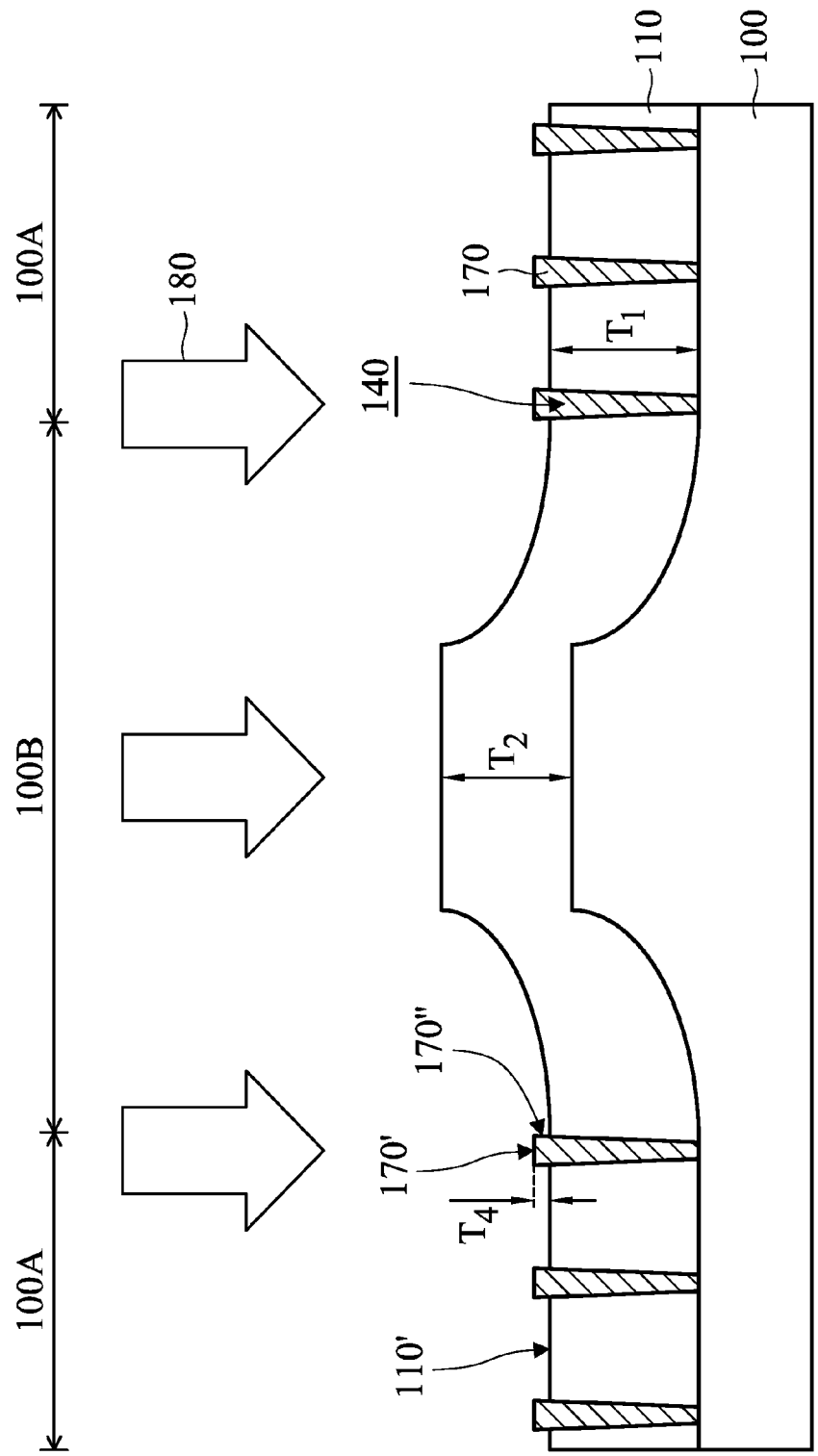

Afterwards, the dielectric layer 120 is removed from the dielectric layer 110, as shown in FIG. 1I in accordance with some embodiments. As a result, a sidewall 170" of the upper portion of the conductive features 170 becomes exposed. In some embodiments, the thickness $T_4$ of the upper portion of the conductive features 170 is substantially the same as the thickness $T_3$ of the dielectric layer 120.

In some embodiments, an etching process 180 is performed to remove the dielectric layer 120. In some embodiments, the etching rate of the dielectric layer 120 is much greater than that of the dielectric layer 110. In some embodiments, the etching rate of the dielectric layer 120 is much greater than that of the conductive features 170 (i.e., the conductive material layer in the openings 140).

In some embodiments, the etchant used in the etching process 180 has a sufficiently high etch selectivity of the dielectric layer 120 to the dielectric layer 110. As a result, the dielectric layer 120 is etched faster than the dielectric layer 110. Accordingly, it is easier to cleanly remove the dielectric layer 120 without residue and without damaging the dielectric layer 110. In some embodiments, the etch selectivity of the dielectric layer 120 to the dielectric layer 110 is greater than that of the conductive features 170 to the dielectric layer 110.

In some embodiments, the etching process 180 includes a wet etching process, a dry etching process or another applicable process. In some embodiments, the etchant includes phosphoric acid or another suitable etchant.

Figure 1J:
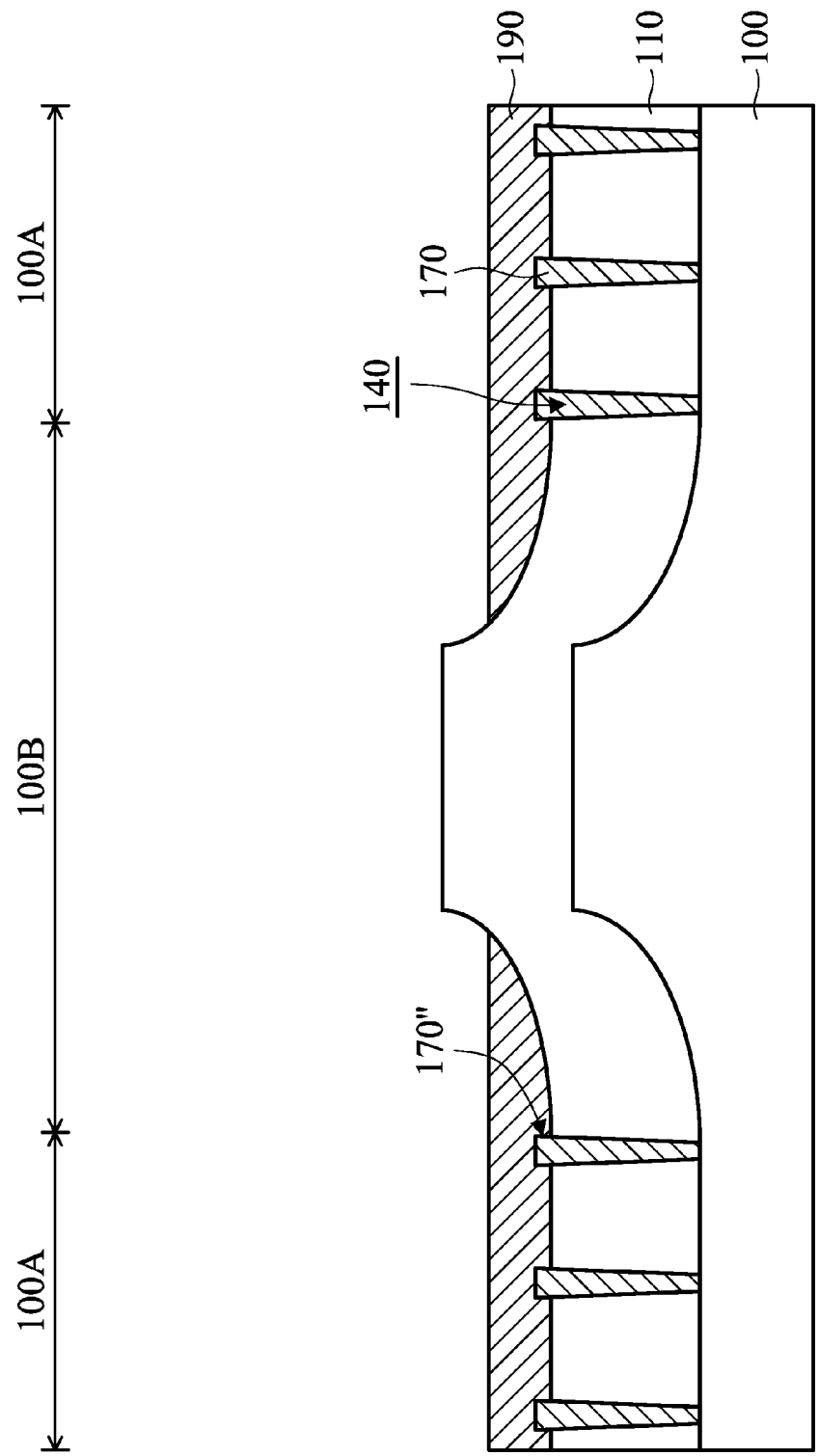

As shown in FIG. 1J, a conductive layer 190 is formed over the dielectric layer 110 in the low topography region 100A and the high topography region 100B, in accordance with some embodiments. The conductive layer 190 is electrically connected to device elements in the substrate 100 through the conductive features 170. The conductive layer 190 may serve as conductive lines of the interconnection structure.

In some embodiments, the conductive layer 190 covers the exposed sidewall 170" of the upper portion of the conductive features 170. In some embodiments, the conductive layer 190 continuously encloses the upper portion of the conductive features 170. In some embodiments, the upper portion of the conductive features 170 is immersed in the conductive layer 190. In some embodiments, the conductive layer 190 is in direct contact with the conductive features 170 and the dielectric layer 110.

It should be noted that the position or profile of the conductive layer 190 shown in figures is only an example and is not a limitation to the disclosure. In some other embodiments, one or more of the conductive features 170 are positioned in the high topography region 100B and the conductive layer 190 extends to the conductive features 170 in the high topography region 100B.

In some embodiments, the conductive layer 190 is made of copper, aluminum, tungsten, titanium, nickel, gold, platinum, silver, another suitable material, or a combination thereof. In some embodiments, the material of the conductive layer 190 is different from that of the conductive features 170. For example, the conductive layer 190 includes copper while the conductive features 170 include tungsten. In some embodiments, the conductive layer 190 is deposited using a CVD process, a PVD process, an electroplating process, an electroless plating process, another applicable process, or a combination thereof.

Afterwards, one or more dielectric layers and conductive features are formed on the dielectric layer 110 and the conductive layer 190 to continue the formation of the interconnection structure. In some embodiments, the processes illustrated in FIGS. 1B-1J are repeated one or more times to form one or more dielectric layers and conductive features. Various device elements are interconnected through the interconnection structure to form integrated circuit devices. For example, the integrated circuit devices include logic devices, memory devices (e.g., static random access memories, SRAMs), radio frequency (RF) devices, input/output (I/O) devices, system-on-chip (SoC) devices, image sensor devices, other applicable types of devices, or a combination thereof.

In some embodiments, the formation method shown in FIGS. 1A-1J is used to form a conductive feature in an interconnection structure of a semiconductor device structure. Many variations and/or modifications can be made to embodiments of the disclosure. In some other embodiments, the formation method described in the disclosure can be used to form a single or dual damascene structure in an interconnection structure or any suitable conductive feature in a dielectric layer. Embodiments of the disclosure are not limited and may be applied to fabrication processes for any suitable technology generation. Various technology generations include a 20 nanometer (nm) node, a 16 nm node, a 10 nm node, a 7 nm node, or another suitable node.

In some cases, a conductive material is deposited over a dielectric layer and fills an opening of the dielectric layer. Subsequently, a planarization process (e.g., a CMP process) is performed over the conductive material to remove the excess conductive material outside of the opening and form a conductive feature in the dielectric layer. The process time for the planarization process may be predetermined according to the thickness of the dielectric layer and the property of polishing slurry used in the planarization process. As a result, it may be difficult to control the final thickness of the dielectric layer after the planarization process.

During the planarization process, some portions of the dielectric layer may be partially removed and become thinner. In particular, some portions of the dielectric layer over an area of high topography may become much thinner than those over an area of low topography. As a result, the distance between a conductive feature below the dielectric layer and a conductive feature over the dielectric layer is reduced. Accordingly, current leakage or short circuiting may be an issue of concern.

In some cases, an upper portion of the conductive feature formed in the dielectric layer may be oxidized and then may be corroded. As a result, the conductive feature formed in the dielectric layer is recessed from the top surface of the dielectric layer. For example, a gap or opening is formed between the conductive feature in the dielectric layer and the conductive feature over the dielectric layer. Accordingly, the conductive feature over the dielectric layer is separated from the conductive feature in the dielectric layer and thus fails to electrically connect thereto. Alternatively, due to the gap or opening, the interface between the conductive feature in the dielectric layer and the conductive feature over the dielectric layer is shrunk. The resistivity of the semiconductor device structure may be increased undesirably.

In accordance with some embodiments, there is a second dielectric layer between a first dielectric layer and a third dielectric layer to serve as a stop layer of a planarization process. The planarization process is performed on a conductive material layer over the third dielectric layer until the top surface of the second dielectric layer is exposed. Due to the second dielectric layer, it becomes easier to precisely control the planarization process. It can be ensured that the conductive material layer over the third dielectric layer is cleanly removed without residue and the first dielectric layer below the second dielectric layer is scarcely removed during the planarization process.

After the planarization process, a conductive feature is formed in the first dielectric layer. Subsequently, the second dielectric layer is removed and a conductive layer is formed over the first dielectric layer. No matter whether the region is one of low topography or high topography, the first dielectric layer keeps substantially the same initial thickness and profile during the planarization process. As a result, the distance between device elements below the first dielectric layer and the conductive layer over the first dielectric layer is substantially the same as the initial thickness of the first dielectric layer. The distance between device elements and the conductive layer can be accurately controlled according to the depositing thickness of the first dielectric layer. Therefore, current leakage or short circuiting between device elements and the conductive layer may be significantly mitigated or eliminated.

Since the second dielectric layer serves as a stop layer of the planarization process, the conductive feature in the first dielectric layer has an upper portion protruding from the first dielectric layer. The upper portion of the conductive feature is embedded in the conductive layer. It can be ensured that the conductive feature is successfully electrically connected to the conductive layer. The resistivity of the semiconductor device structure is prevented from being increased. Therefore, the device performance and reliability of the semiconductor device structure is enhanced significantly.

Furthermore, the thickness of the upper portion of the conductive feature, which protrudes from the first dielectric layer, is substantially the same as the initial thickness of the second dielectric layer. It is easy to precisely control the thickness of the upper portion of the conductive feature according to the depositing thickness of the second dielectric layer. Therefore, embodiments of the disclosure provide an accurate planarization process and a formation method of a semiconductor device structure with high device performance and reliability.

In accordance with some embodiments, a method for forming a semiconductor device structure is provided. The method includes providing a substrate having a low topography region and a high low topography region. The method also includes forming a first dielectric layer over the substrate. The method further includes forming a second dielectric layer over the stop layer. In addition, the method includes forming an opening in the first dielectric layer, the stop layer and the second dielectric layer. The method also includes forming a conductive material layer over the second dielectric layer. The conductive material layer fills the opening. The method further includes performing a polishing process over the conductive material layer until a top surface of the stop layer is exposed.

In accordance with some embodiments, a method for forming a semiconductor device structure is provided. The method includes providing a substrate having a first region and a second region. The first region and the second region have different topographies. The method also includes forming a dielectric layer over the substrate. The method further includes forming a stop layer over the dielectric layer and the substrate in the first region and the second region. In addition, the method includes forming an opening in the dielectric layer and the stop layer. The method also includes forming a conductive material layer over the stop layer. The conductive material layer fills the opening. The method further includes performing a planarization process over the conductive material layer until the conductive material layer outside of the opening is substantially removed.

In accordance with some embodiments, a method for forming a semiconductor device structure is provided. The method includes providing a substrate having a low topography region and a high low topography region. The method also includes forming a dielectric layer over the substrate. The method further includes forming a stop layer over the dielectric layer. In addition, the method includes forming an opening in the dielectric layer and the stop layer to partially expose the substrate in the low topography region. The method also includes forming a tungsten layer over the stop layer. The tungsten layer fills the opening. The method further includes performing a chemical mechanical polishing process until the tungsten layer outside of the opening is substantially removed. A remaining portion of the conductive material layer in the opening form a conductive plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method for forming a semiconductor device structure, comprising:
    providing a substrate having a low topography region and a high topography region;
    forming a first dielectric layer over the substrate;
    forming a stop layer over the first dielectric layer and the substrate in the low topography region and the high topography region;
    forming a second dielectric layer over the stop layer;
    forming an opening in the first dielectric layer, the stop layer and the second dielectric layer;
    forming a conductive material layer over the second dielectric layer, wherein the conductive material layer fills the opening;
    performing a polishing process over the conductive material layer until a top surface of the stop layer is exposed; and
    removing the stop layer after the planarization process.
2. The method for forming a semiconductor device structure as claimed in claim 1, wherein a polish selectivity of the second dielectric layer to the stop layer is greater than that of the second dielectric layer to the conductive material layer during the polishing process.
3. The method for forming a semiconductor device structure as claimed in claim 1, wherein the formation of the stop layer comprises selecting a material of the stop layer so that a polishing rate of the material is less than that of the second dielectric layer during the polishing process.
4. The method for forming a semiconductor device structure as claimed in claim 1, wherein the first dielectric layer and the second dielectric layer comprises the same material.

5. The method for forming a semiconductor device structure as claimed in claim 1, wherein the first or second dielectric layer comprises oxide and the stop layer comprises nitride.

6. The method for forming a semiconductor device structure as claimed in claim 1, wherein the stop layer is thinner than the first or second dielectric layer.

7. The method for forming a semiconductor device structure as claimed in claim 1, wherein the opening is over the substrate in the low topography region.

8. The method for forming a semiconductor device structure as claimed in claim 1, further comprising:
forming a conductive layer over the dielectric layer and the substrate in the low topography region and the high topography region.

9. A method for forming a semiconductor device structure, comprising:
providing a substrate having a first region and a second region, wherein the first region and the second region have different topographies;
forming a dielectric layer over the substrate;
forming a stop layer over the dielectric layer and the substrate in the first region and the second region;
forming an opening in the dielectric layer and the stop layer;
forming a conductive material layer over the stop layer, wherein the conductive material layer fills the opening;
performing a planarization process over the conductive material layer until the conductive material layer outside of the opening is substantially removed; and
removing the stop layer after the planarization process so that a top surface of the dielectric layer is exposed.

10. The method for forming a semiconductor device structure as claimed in claim 9, wherein the planarization process comprises a chemical mechanical polishing process.

11. The method for forming a semiconductor device structure as claimed in claim 9, wherein the conductive material layer comprises tungsten.

12. The method for forming a semiconductor device structure as claimed in claim 9, further comprising:
forming a conductive layer over the top surface of the dielectric layer.

13. The method for forming a semiconductor device structure as claimed in claim 9, wherein the removal of the stop layer comprises performing an etching process, and an etching rate of the stop layer is greater than that of the dielectric layer.

14. The method for forming a semiconductor device structure as claimed in claim 13, wherein the etching process comprises a wet etching process or a dry etching process.

15. The method for forming a semiconductor device structure as claimed in claim 9, wherein the removal of the stop layer comprises performing an etching process, and an etch selectivity of the stop layer to the dielectric layer is greater than that of the conductive material layer in the opening to the dielectric layer.

16. A method for forming a semiconductor device structure, comprising:
providing a substrate having a low topography region and a high topography region;
forming a dielectric layer over the substrate;
forming a stop layer over the dielectric layer;
forming an opening in the dielectric layer and the stop layer to partially expose the substrate in the low topography region;
forming a tungsten layer over the stop layer, wherein the tungsten layer fills the opening;
performing a chemical mechanical polishing process until the tungsten layer outside of the opening is substantially removed, and a remaining portion of the conductive material layer in the opening form a conductive plug; and
removing the stop layer after the formation of the conductive plug.

17. The method for forming a semiconductor device structure as claimed in claim 16, further comprising:
forming a copper layer over the dielectric layer after the removal of the stop layer.

18. The method for forming a semiconductor device structure as claimed in claim 16, wherein the stop layer is removed by phosphoric acid.

19. The method for forming a semiconductor device structure as claimed in claim 16, wherein the formation of the opening comprises performing an etching process.

20. The method for forming a semiconductor device structure as claimed in claim 16, wherein the formation of the dielectric layer and the formation of the stop layer comprise performing the same deposition process.

* * * * *